United States Patent [19]
Asai

[11] Patent Number: 5,424,153
[45] Date of Patent: Jun. 13, 1995

[54] OPTICAL MASK USING PHASE SHIFT AND METHOD OF PRODUCING THE SAME

[75] Inventor: Satoru Asai, Kawasaki, Japan
[73] Assignee: Fujitsu Limited, Kawasaki, Japan
[21] Appl. No.: 139,782
[22] Filed: Oct. 22, 1993

Related U.S. Application Data

[63] Continuation of Ser. No. 757,324, Sep. 10, 1991, abandoned.

[30] Foreign Application Priority Data

Sep. 10, 1990 [JP] Japan ................................. 2-237110
Jan. 23, 1991 [JP] Japan ................................. 3-021483

[51] Int. Cl.$^6$ ................................. G03F 9/00
[52] U.S. Cl. ................................. 430/5; 430/311; 430/320
[58] Field of Search ................................. 430/5, 311, 320

[56] References Cited

U.S. PATENT DOCUMENTS 5,045,417  9/1991  Okamoto ................................. 430/5

FOREIGN PATENT DOCUMENTS

| 0395425 | 10/1990 | European Pat. Off. . |
| 0437376 | 7/1991 | European Pat. Off. . |
| 0453310 | 10/1991 | European Pat. Off. . |
| 2-34854 | 2/1990 | Japan . |
| 2-211451 | 11/1990 | Japan . |

OTHER PUBLICATIONS

*Patent Abstracts of Japan*, vol. 14, No. 376 (P-1092) Aug. 14, 1990 & JP-A-2 140743 (Hitachi Ltd) May 30, 1990.

Primary Examiner—Mark A. Chapman
Attorney, Agent, or Firm—Staas & Halsey

[57] ABSTRACT

A phase shift optical mask is used for exposing a pattern using an exposure light. The phase shift optical mask includes a substrate which is transparent with respect to the exposure light, a light blocking layer which is nontransparent with respect to the exposure light and is provided on the substrate, where the light blocking layer has an opening having a predetermined shape and size and being defined by a side wall of the light blocking layer, and a phase shift layer which is transparent with respect to the exposure light and is provided on the light blocking layer and the substrate which is exposed within the opening. The phase shift layer has a uniform thickness, and the light blocking layer has a predetermined thickness so that a phase of the exposure light transmitted through the phase shift layer provided on the side wall of the light blocking layer is shifted by approximately 180° relative to a phase of the exposure light transmitted through the phase shift layer provided on the substrate.

27 Claims, 10 Drawing Sheets

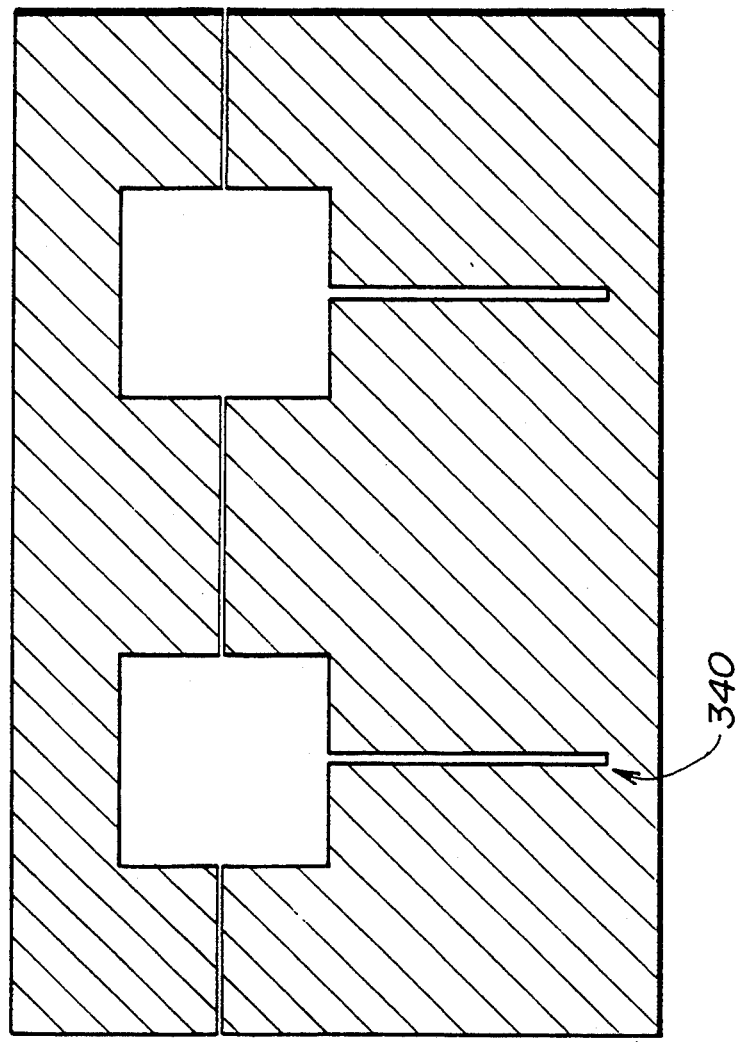

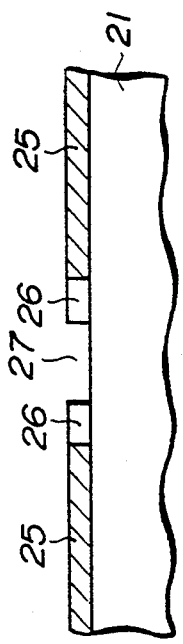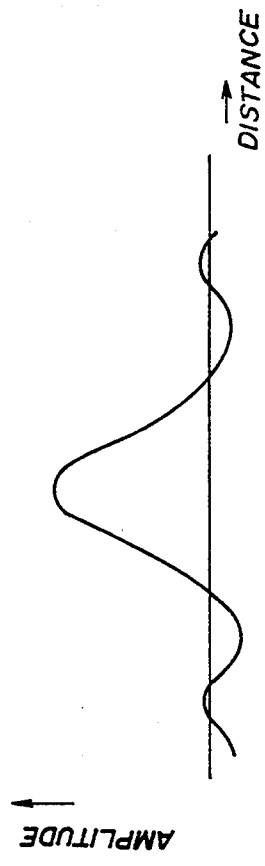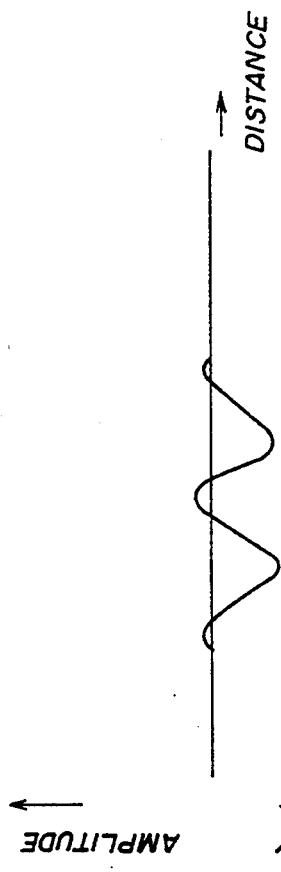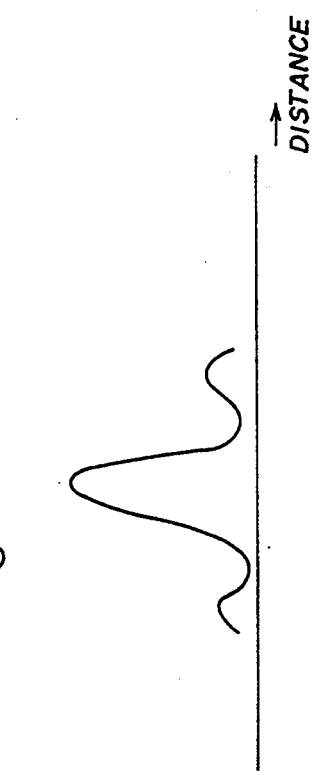
FIG.8A PRIOR ART
FIG.8B PRIOR ART
FIG.8C PRIOR ART
FIG.8D PRIOR ART

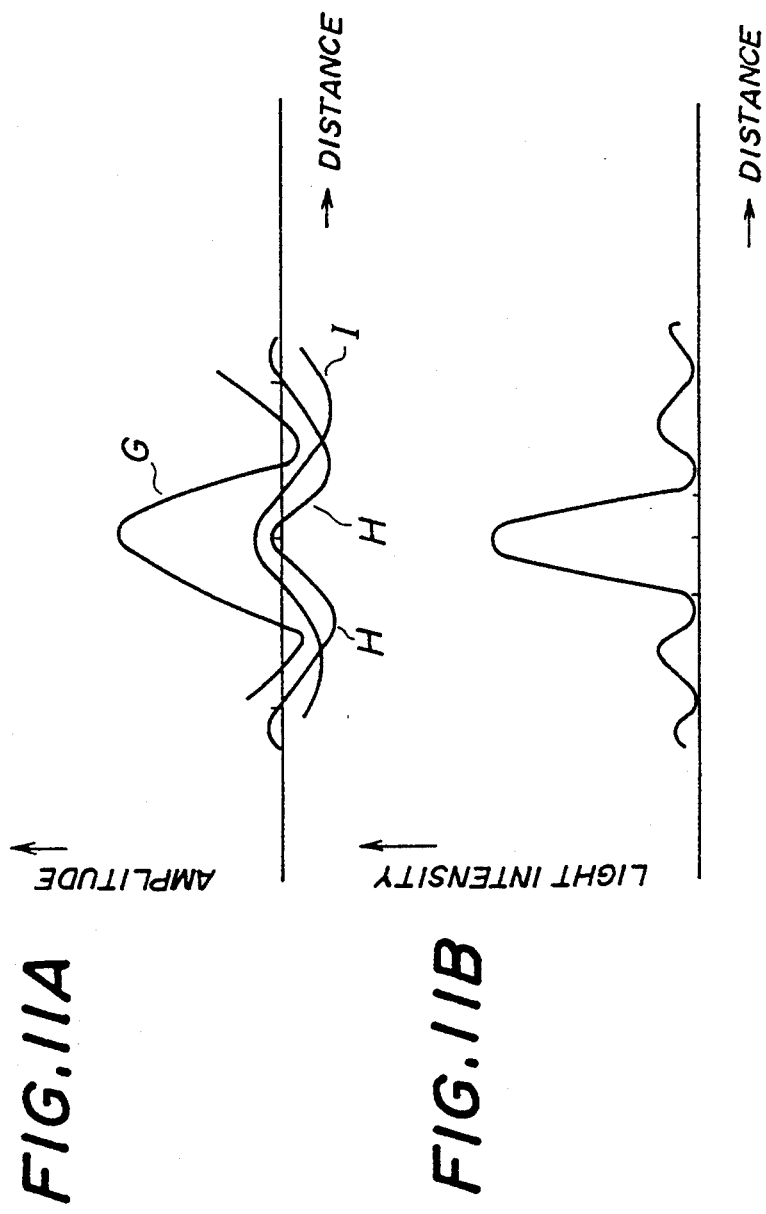

OPTICAL MASK USING PHASE SHIFT AND METHOD OF PRODUCING THE SAME

This application is a continuation of application Ser. No. 07/757,324, filed Sep. 10, 1991, now abandoned.

BACKGROUND OF THE INVENTION

The present invention generally relates to optical masks and methods of producing the same, and more particularly to an optical mask which uses a phase shift exposure to improve the resolution, and a method of producing such an optical mask.

There are demands to increase the operating speed of large scale integrated circuits (LSIs), such as a memory device having a large memory capacity, and to improve the integration density of the LSIs. For this reason, there are demands to realize a fine photolithography technique.

As one prominent means of satisfying the above demands, there is a phase shift exposure technique which employs an optical mask using a phase shift, and a coherent light source which emits an exposure light having a wavelength which is as short as possible. The optical mask using the phase shift will hereinafter be referred to as a phase shift optical mask.

FIG.1 shows in cross section an example of a conventional phase shift optical mask. The phase shift optical mask shown in FIG.1 includes a glass substrate 11, a chromium (Cr) layer 12 and a silicon dioxide ($SiO_2$) layer 13 which forms a phase shift part.

When producing this phase shift optical mask, the Cr light blocking layer 12 which blocks the exposure light is formed on the entire surface of the glass substrate 11 which is transparent with respect to the exposure light. Then, the $SiO_2$ layer 13 which is also transparent with respect to the exposure light is formed on the Cr light blocking layer 12 to a thickness such that the phase of the exposure light is shifted by 180°.

Thereafter, a resist layer (not shown) with an opening is formed on the $SiO_2$ layer 13 and the $SiO_2$ layer 13 is etched using a photolithography technique so as to form an opening 14. This opening 14 has the size and shape of a predetermined main light transmitting part. Next, the $SiO_2$ layer 13 is used as a mask and the Cr light blocking layer 12 which is within the opening 14 is subjected to an isotropic etching. As a result, the $SiO_2$ layer 13 overhangs above the Cr light blocking layer 12 to form the phase shift part.

However, when the phase shift optical mask is subjected to a cleaning or brushing during the production stage or in a stage before the phase shift optical mask is actually used, there are problems in that the $SiO_2$ layer 13 easily separates from the Cr light blocking layer 12 and that a part of the $SiO_2$ layer 13 may become damaged and come off the phase shift optical mask.

On the other hand, when producing the phase shift optical mask by the conventional technology, there is a limit to the precision with which the patterns may be formed by the photolithography technique. For this reason, there a problem in that it is extremely difficult to form, in the $SiO_2$ layer 13 an opening which has a desired size and shape. In addition, when subjecting the Cr light blocking layer 12 to a side etching, there is also a problem in that it is difficult to control the side etching quantity.

In other words, the light intensity distribution of the exposure light transmitted through the phase shift optical mask is dependent on a width L2 of the $SiO_2$ layer 13 overhanging the Cr light blocking layer 12, as will be described hereunder. FIG.2A shows the light intensity distribution of the exposure light transmitted through the phase shift optical mask shown in FIG. 1 when L1=0.50 μm and L2=0.15 μm, where L1 denotes the width of the Cr light blocking layer 12. Similarly, FIG. 2B shows the light intensity distribution for a case where L1=0.5 μm and L2=0.20 μm, and FIG. 2C shows the light intensity distribution for a case where L1=0.50 μm and L2=0.10 μm. In other words, FIGS. 2B and 2C respectively show the distributions for the cases where the width L2 of the $SiO_2$ layer (phase shift part) 13 is varied by ±0.05 μm on the wafer.

In FIGS. 2A through 2C, a solid line indicates the distribution at a defocus of 0.000 μm, a dashed line indicates the distribution at a defocus of 0.300 μm, a fine dotted line indicates the distribution at a defocus of 0.600 μm, a one-dot chain line indicate the distribution at a defocus of 0.900 μm, and a two-dot chain line indicates the distribution at a defocus of 1.200 μm. Further, the wavelength λ of the exposure light is 0.365 μm, the numerical aperture (NA) of an exposure lens is 0.54, and the coherency factor σ is 0.30.

In the case shown in FIG. 2B, the resist layer on the wafer is exposed by the peaks appearing on both sides of the distribution, and more of the resist layer is developed when compared to the case shown in FIG. 2A. The width of the opening in the resist layer after the developing step is approximately the distance in the distribution at the light intensity of 0.3. In the case shown in FIG. 2B, the width of the opening in the resist layer is 0.35 μm which is slightly smaller than the width of 0.36 μm which is obtained in the case shown in FIG. 2A. On the other hand, in the case shown in FIG. 2C, the width of the opening in the resist layer is 0.39 μm which is considerably greater than the 0.36 μm obtained in the case shown in FIG. 2A. Therefore, it can be seen that the deviation of ±0.05 μm of the width L2 exceeds the tolerable deviation range.

The side etching of the Cr layer 12 lacks stability, and the side etching rate is greatly dependent on the conditions of the preprocessing, which is carried out before the side etching, and also the etching pattern or etching area. Particularly, the side etching rate varies from 0.03 μm/min to 0.07 μm/min, and under this variation range, an error of 0.05 μm appears on the wafer at 3σ. Therefore, as described above, it is extremely difficult to control the width L2 of the $SiO_2$ layer 13 to a desired value which is within a tolerable range when the side etching of the Cr layer 12 is required.

SUMMARY OF THE INVENTION

Accordingly, it is a general object of the present invention to provide a novel and useful optical mask and method of producing the same, in which the problems described above are eliminated.

Another and more specific object of the present invention is to provide a phase shift optical mask used for exposing a pattern using an exposure light, comprising a substrate which is transparent with respect to the exposure light, a light blocking layer which is non-transparent with respect to the exposure light and is provided on the substrate, wherein the light blocking layer has an opening having a predetermined shape and size and being defined by a side wall of the light blocking layer, and a phase shift layer, which is transparent with respect to the exposure light and is provided on the light blocking layer and on the substrate surface which is exposed within the opening. The phase shift layer has a uniform thickness, and the light blocking layer has a predetermined thickness so that the phase of the exposure light transmitted through the phase shift layer, provided on the side wall of the light blocking layer, is shifted by approximately 180° relative to a phase of the exposure light which is transmitted through the phase shift layer provided on the substrate. According to the optical mask of the present invention, it is possible to improve the resolution and expose a fine pattern exceeding a limit of the conventional photolithography technique. In addition, no damage is made to the optical mask during the cleaning and brushing processes.

Still another object of the present invention is to provide a phase shift optical mask used for exposing a pattern on a wafer via an exposure lens using an exposure light, comprising a substrate which is transparent with respect to the exposure light, a light transmitting region provided on the substrate and having a width $m(L+0.2 \lambda/NA)$, wherein m denotes a reducing projection magnification, L denotes a width of an opening actually developed on the wafer, $\lambda$ denotes a wavelength of the exposure light and NA denotes a numerical aperture of an exposing lens, a first phase shift region which is transparent with respect to the exposure light and is provided on both sides of the light transmitting region, wherein the first phase shift region has a width $(m\lambda/2\ NA)[1.1-(NA/\lambda)(L+0.2\ \lambda/NA)]$ on both sides of the light transmitting region, a first light blocking region which is non-transparent with respect to the exposure light and is provided on both outer sides of the first phase shift region, wherein the first light blocking region has a width $0.1\ m\lambda/NA$ on both outer sides of the first phase shift region, a second phase shift region which is transparent with respect to the exposure light and is provided on both outer sides of the first light blocking region, wherein the second phase shift region has a width $0.1\ m\lambda/NA$ on both outer sides of the first light blocking region, and a second light blocking region which is non-transparent with respect to the exposure light and is provided on both outer sides of the second phase shift region. According to the optical mask of the present invention, it is possible to expose a line pattern of $0.45 \times (\lambda/NA)$ $\mu$m or even less.

A further object of the present invention is to provide a method of producing a phase shift optical mask which is used for exposing a pattern using an exposure light, comprising the steps of forming an opening in a light blocking layer which is provided on a substrate, wherein the light blocking layer is non-transparent with respect to the exposure light, the substrate is transparent with respect to the exposure light and the opening has a predetermined shape and size defined by a side wall of the light blocking layer, and forming a phase shift layer which is transparent with respect to the exposure light on the light blocking layer and the substrate which is exposed within the opening, wherein the phase shift layer is formed to a uniform thickness. The light blocking layer has a predetermined thickness so that the phase of the exposure light transmitted through the phase shift layer provided on the side wall of the light blocking layer is shifted by approximately 180° relative to a phase of the exposure light transmitted through the phase shift layer provided on the substrate. According to the method of the present invention, it is possible to accurately form an opening using the conventional photolithography technique, and the size of the opening can be reduced to a degree or level, exceeding the limit of the conventional photolithography technique without deteriorating the accuracy.

Another object of the present invention is to provide a method of producing a phase shift optical mask used for exposing a pattern on a wafer via an exposure lens using an exposure light, comprising the steps of forming an opening, which has a width of $1.5\ m\lambda/NA$, in a first light blocking layer which is provided on a substrate, wherein the first light blocking layer is non-transparent with respect to the exposure light, the substrate is transparent with respect to the exposure light, m denotes a reducing projection magnification, L denotes a width of an opening actually developed on the wafer, $\lambda$ denotes a wavelength of the exposure light and NA denotes a numerical aperture of an exposing lens, forming a first phase shift layer on the first light blocking layer and the surface of the substrate which is exposed within the opening, wherein the first phase shift layer is transparent with respect to the exposure light and has a stepped part in correspondence with the opening and the first phase shift layer has a thickness $0.1\ m\lambda/NA$ on a side wall of the first light blocking layer defining the opening, forming a second light blocking layer on the first phase shift layer, wherein the second light blocking layer is non-transparent with respect to the exposure light and having a thickness $0.1\ m\lambda/NA$ on the side wall of at the stepped part of the first phase shift layer, and forming a second phase shift layer on a side wall of the second light blocking layer on the first phase shift layer, wherein the second phase shift layer is transparent with respect to the exposure light and having a width $(m\lambda/2\ NA)[1.1-(NA/\lambda)(L+0.2\ \lambda/NA)]$. According to the method of the present invention, it is possible to produce an optical mask which enables the exposure of a line pattern which is $0.45 \times (\lambda/NA)$ $\mu$m or even less.

Other objects and further features of the present invention will be apparent from the following detailed description when read in conjunction with the accompanying drawings.

BRIEF DESCRIPTION OF THE DRAWINGS

FIG. 6 is a plan view showing an actual pattern formed on a wafer by using the first embodiment of the optical mask;

FIG. 8A is a cross sectional view for explaining a second conventional phase shift optical mask;

FIG. 8B shows amplitude and phase characteristics of light transmitted through a light transmitting region of the phase shift optical mask shown in FIG. 8A;

FIG. 8C shows amplitude and phase characteristics of light transmitted through a phase shift region of the phase shift optical mask shown in FIG. 8A;

FIG. 8D shows light intensity of transmitted light in correspondence with FIG. 8A;

FIG. 11A shows amplitude and phase characteristics of light transmitted through a light transmitting region, a first phase shift region and a second phase shift region of the optical mask shown in FIG. 10;

FIG. 11B shows light intensity of transmitted light in correspondence with FIG. 11A.

DESCRIPTION OF THE PREFERRED EMBODIMENTS

First, a description will be given of an operating principle of an optical mask according to the present invention, by referring to FIGS. 3A through 3D.

Figure 3A:
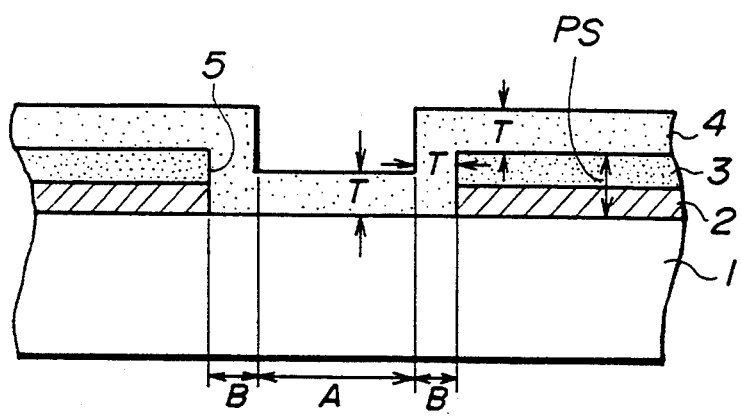
FIG. 3A is a cross sectional view for explaining an operating principle of an optical mask according to the present invention.

In FIG. 3A, the phase shift optical mask includes a glass substrate 1, a light blocking layer 2, a first inorganic layer 3 and a second inorganic layer 4. A main light transmitting part A is surrounded by a phase shift part B. The first and second inorganic layers 3 and 4 are made of an inorganic material, and the second inorganic layer 4 has a thickness T. The total thickness PS, of the light blocking layer 2 and the first inorganic layer 3, corresponds to the required thickness of the material of layer 4 in each of the parts B, in which light propagating therethrough undergoes a phase shift of approximately 180° relative to light propagating through the transmitting part A.

Next, a description will be given of the resolution improving effect which is obtained by the edge emphasis type phase shift optical mask according to the present invention.

Figure 3B:
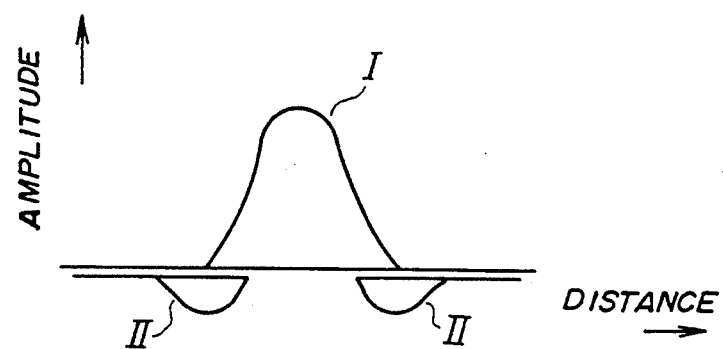
FIG. 3B shows amplitude and phase characteristics of transmitted light in correspondence with FIG. 3A.

FIG. 3B shows the amplitude and the phase characteristic of the light which is transmitted through the main light transmitting part A and the phase shift part B of the phase shift optical mask. A curve I indicates the light transmitted through the main light transmitting part A, and each curve II indicates the light transmitted through the corresponding phase shift part B. As may be seen from FIG. 3B, the phase of the light transmitted through each phase shift part B is shifted by 180° with respect to the phase of the light transmitted through the main light transmitting part A.

Figure 3C:
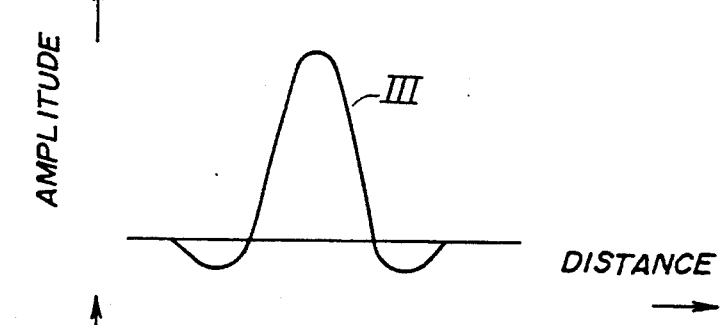
FIG. 3C shows amplitude and phase characteristics of synthesized transmitted light in correspondence with FIG. 3A.

FIG. 3C shows in curve III the amplitude and the phase characteristic of a synthesized light in which the light transmitted through the main light transmitting part A and the light transmitted through the phase shift part B are synthesized. The curve III of this synthesized light is sharper as compared to the curve I, because at the bottom portions of the curve III, the light transmitted through the main light transmitting part A is cancelled by the light which is transmitted through the phase shift part B and which has an inverted phase relative to that of the light transmitted through the main light transmitting part A.

Figure 3D:
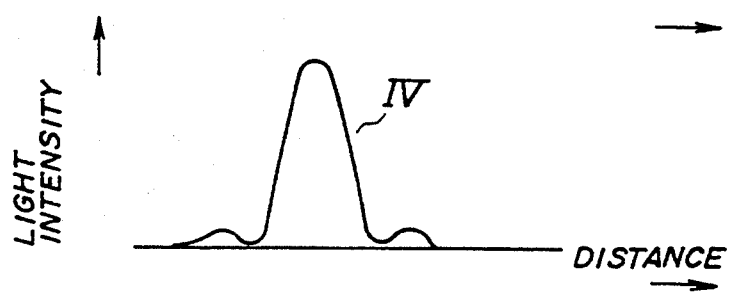
FIG. 3D shows light intensity of transmitted light in correspondence with FIG. 3A.

In FIG. 3D, a curve IV indicates the intensity of the transmitted light. This curve IV corresponds to a square of the amplitude indicated by the curve III shown in FIG. 3C. The curve IV is very sharp because of the light transmitted through the phase shift part B. Hence, it may be seen from FIG. 3D that the resolution is improved when carrying out an exposure using the mask of the invention.

Next, a description will be given of a method of producing the phase shift optical mask shown in FIG. 3A.

First, the light blocking layer 2 is formed on the entire surface of the glass substrate 1, and the first inorganic layer 3 is formed on the entire surface of the light blocking layer 2. The total thickness PS of the light blocking layer 2 and the first inorganic layer 3 is set so that the exposure light is shifted by 180° by the second inorganic layer 4 which is later formed.

The thickness PS for realizing the 180° phase shift, by use of the second inorganic layer 4, is calculated as follows. That is, since the propagation velocity of the exposure light is inversely proportional to the refractive index of the medium through which the exposure light propagates, the thickness of the medium should be set to $\lambda/2(n-1)$ for shifting the phase of the exposure light as propagated therethrough by 180°, as compared to the exposure light propagating through air, wherein n denotes the refractive index of the medium and $\lambda$ denotes the wavelength of the exposure light.

In this case, it is unnecessary to provide the first inorganic layer 3 if the thickness PS can be provided using only the light blocking layer 2. However, when forming the light blocking layer 2 from a metal, problems are introduced due to the difference between the respective coefficients of thermal expansion of the layers if the metal light blocking layer 2 is made thick. Furthermore, when the metal light blocking layer 2 is thick, the etching of the metal light blocking layer 2 at the later stage becomes that much difficult. For this reason, it is desirable to form, on the light blocking layer 2, the first inorganic layer 3 which has approximately the same coefficient of thermal expansion as that of the glass substrate 1, and then to adjust the thickness PS in accordance with the total of the respective thickness of the light blocking layer 2 and the first inorganic layer 3.

Figure 1:
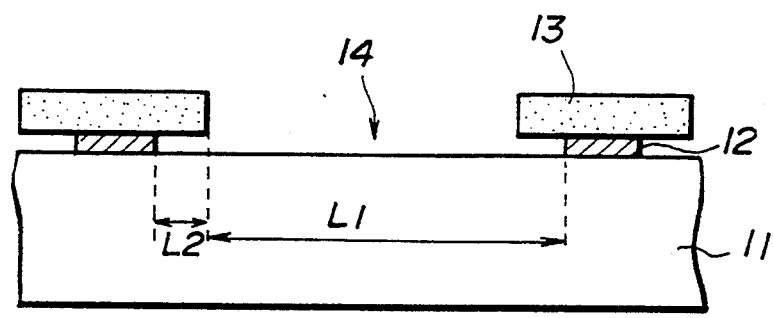
FIG. 1 is a cross sectional view showing an essential part of an example of a conventional phase shift optical mask.

Second, an opening 5 for exposure is formed in the first organic layer 3 and the light blocking layer 2 by a photolithography technique. The width of this opening 5 is A+2 T, wherein A denotes the width of the main light transmitting part A after completion and T denotes the thickness of the second inorganic layer 4 which is later formed. Hence, the width of the opening 5 is 2 T wider than the width of the opening 14 of the conventional phase shift optical mask shown in FIG. 1, thereby making it possible to accurately form the opening 5 with a satisfactory reproducibility using the normal photolithography technique.

Third, the second inorganic layer 4 is formed on the first inorganic layer 3 and the portion of the glass substrate 1 which is exposed within the opening 5, using a chemical vapor deposition (CVD) or the like. The thickness of the second inorganic layer 4 which is formed by the CVD is uniform, and the thickness T of the second inorganic layer 4 deposited on the first inorganic layer 3 can be made the same as the width T of the second inorganic layer 4 which is deposited on the inner wall defining the opening 5.

In this case, the depth of the stepped part, or depression extending from the surface of the second inorganic layer 4 is maintained the same as the total thickness PS (i.e., the combined respective thicknesses) of the light blocking layer 2 and the first inorganic layer 3. Thus, the depression functions as the main light transmitting part A, and a region which has the width T and is formed on the outer side of the depression on each side functions as the phase shift part B.

Therefore, the size of the completed main light transmitting part A can be controlled accurately using the width A+2 T of the opening 5 as a reference, which opening 5 is formed by the normal photolithography technique.

Next, a description will be given of a first embodiment of the optical mask according to the present invention, by referring to FIG. 4.

Figure 4:
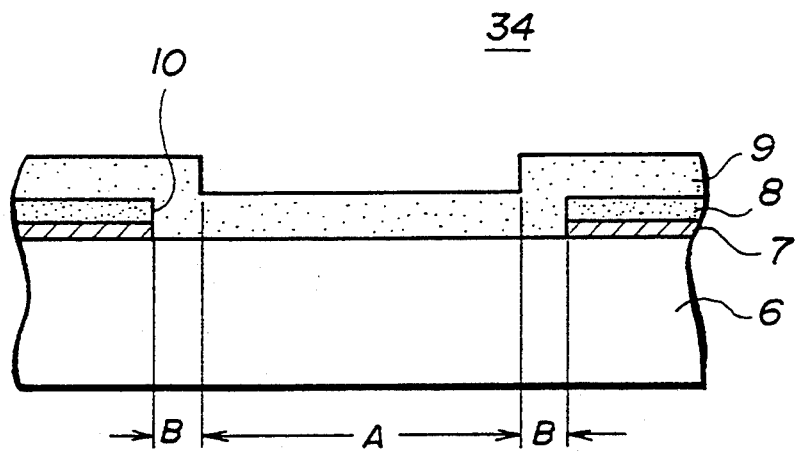
FIG. 4 is a cross sectional view showing an essential part of a first embodiment of the optical mask according to the present invention.
Figure 2A:
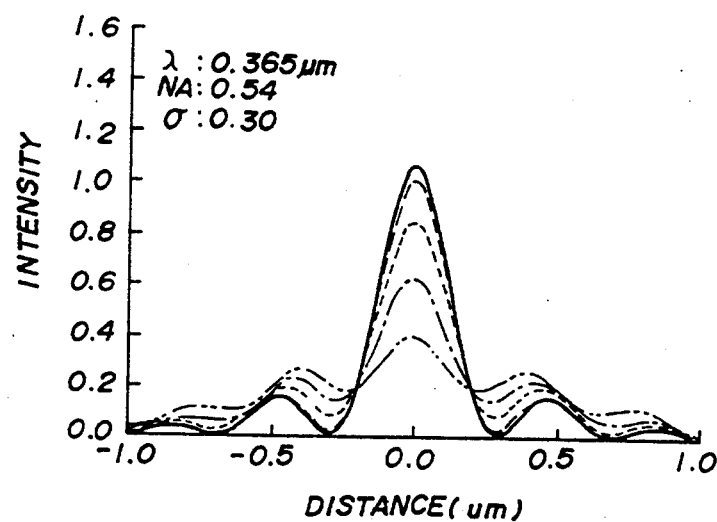
FIGS. 2A through 2C show different light intensity distributions of exposure light transmitted through the phase shift optical mask under respective different conditions.
Figure 2B:
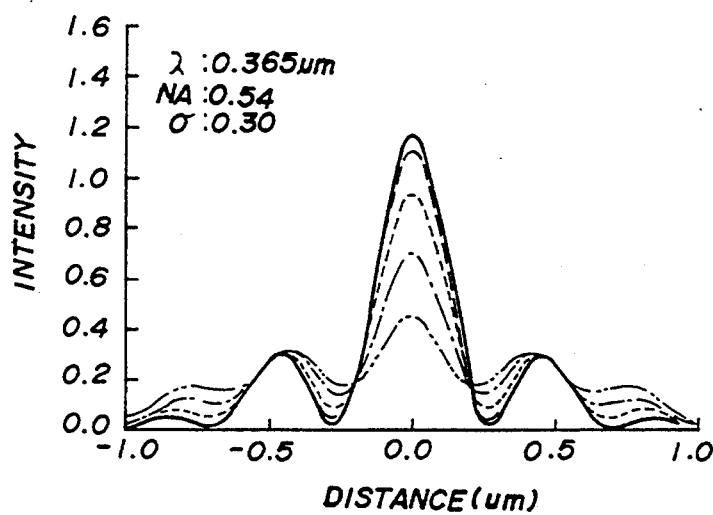
Figure 2C:
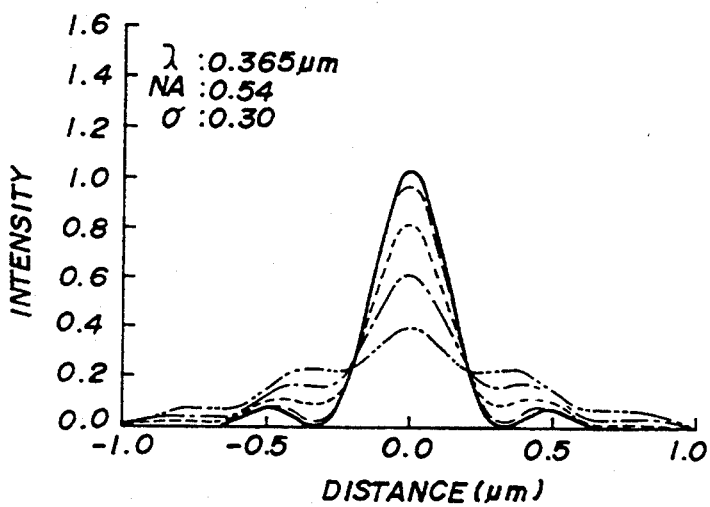

A phase shift optical mask 34 shown in FIG. 4 includes a Cr light blocking layer 7 which is formed on a quartz glass substrate 6, a $SiO_2$ first inorganic layer 8 which is formed on the Cr light blocking layer 7, an opening 10 which is formed in the $SiO_2$ first inorganic layer 8 and the Cr light blocking layer 7, and a $SiO_2$ second inorganic layer 9 which is formed on the $SiO_2$ inorganic layer 8 and the quartz glass substrate 6 which is exposed within the opening 10. The $SiO_2$ second inorganic layer 9 is transparent with respect to the exposure light. A main light transmitting part A is surrounded by the phase shift part B.

This first embodiment of the optical mask according to the present invention may be produced by a first embodiment of a method of producing the optical mask according to the present invention, as follows.

According to the first embodiment of the method, the Cr layer 7 is formed on the quartz glass substrate 6 and the $SiO_2$ layer 8 is formed on the Cr layer 7, so that a total thickness of the Cr layer 7 and the $SiO_2$ layer 8 becomes 4700 Å.

The total thickness of the Cr layer 7 and the $SiO_2$ layer 8 is calculated as follows. That is, since the propagation velocity of the exposure light is inversely proportional to the refractive index of the medium through which the exposure light propagates, the thickness of the medium should be set to $\lambda/2(n-1)$ for shifting the phase of the exposure light by 180°, as compared to the exposure light propagating through air, where n denotes the refractive index of the medium and $\lambda$ denotes the wavelength of the exposure light.

Hence, in the case where the light source is a mercury discharge lamp which emits as the exposure light a g-ray having a wavelength of 4358 Å and the refractive index n of the $SiO_2$ layer 9 is 1.46, the total thickness of the Cr layer 7 and the $SiO_2$ layer 8 can be calculated from $\lambda/2(n-1)$ as 4737 Å or approximately 4700 Å.

Next, a resist layer (not shown) is formed on the entire surface of the $SiO_2$ layer 8, and a resist mask pattern having an opening is formed by a normal electron beam exposure technique. One side of this opening in the resist mask pattern has a length of $1.1 \times m$ $\mu m$ when the reducing projection magnification of a reducing projection type exposure apparatus used therefor is m. Thereafter, the $SiO_2$ layer 8 and the Cr layer 8 are selectively removed via this opening in the resist mask pattern using a dry etching, process step thereby forming an opening 10.

Then, the $SiO_2$ layer 9 is deposited to a thickness of 1 $\mu m$ on the entire surface of the $SiO_2$ layer 8 and the quartz glass substrate 6 which is exposed within the opening 10 using a CVD process step. This thickness of the $SiO_2$ corresponds to $0.2 \times m$ $\mu m$ when M=5.

The phase shift optical mask 34 which is produced by the above described processes has a square main light transmitting part A having a length of each side of $0.7 \times m$ $\mu m$, and a border or frame shaped, phase shift part B having a width of $0.2 \times m$ $\mu m$.

When m=5 in this embodiment, for example, the square opening in the resist mask pattern which is formed on the $SiO_2$ layer 8 has a side of 5.5 $\mu m$, and when the phase shift optical mask 34 is completed, the square main light transmitting part A has a side of 3.5 $\mu m$ and the frame shaped phase shift part B has a width of 1 $\mu m$.

When producing a semiconductor device using the first embodiment of the phase shift optical mask described above, a resist layer which is formed on a semiconductor surface is exposed by passing a g-ray having a wavelength of 4358 Å from a mercury discharge lamp through an optical pattern of the phase shift optical mask 34 and projecting the transmitted g-ray on the resist layer with a size reduction to 1/5th that of the original, for example. In this case, the NA of the exposure lens is 0.45.

Figure 5:
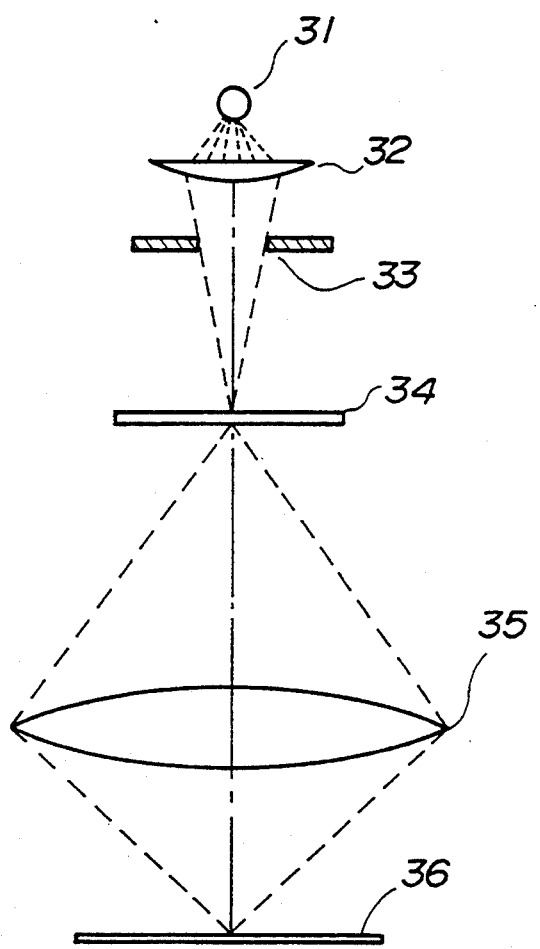
FIG. 5 generally shows an exposure apparatus in which the first embodiment of the optical mask according to the present invention may be employed.

FIG. 5 generally shows an exposure apparatus which is used for carrying out the first embodiment of the method. The g-ray emitted from a mercury discharge lamp 31 irradiates the phase shift optical mask (or reticle) 34 via a condenser lens 32 and an iris 33, and the g-ray transmitted through the phase shift optical mask 34 is converged and irradiated on a wafer 36 via a projection lens 35. The wafer 36 corresponds to the semiconductor surface referred above, and the resist layer which is exposed is formed on the wafer 36.

According to the first embodiment of the optical mask and the first embodiment of the method, the width T of the $SiO_2$ layer (phase shift part) 4 can be controlled accurately by controlling the deposition thickness of the $SiO_2$ layer 4. Using the existing techniques, the deposition thickness of the $SiO_2$ layer 4 can be controlled within a range of $\pm 0.02$ $\mu m$ on the phase shift optical mask 34. However, on the wafer 36, this range is reduced to 1/5th that of the original due to the reduced production, and the error on the wafer 36 is on the order of $\pm 0.004$ $\mu m$ at $3\sigma$. This error of $\pm 0.004$ $\mu m$ is considerably small compared to the error of $\pm 0.05$ $\mu m$ which is introduced in the conventional case described above.

FIG. 6 shows a plan view of an actual pattern which is formed on the wafer 36 using the optical mask 34. For example, the optical mask 34 is particularly suited for use in forming a fine aperture 340 of the pattern shown in FIG. 6.

As described above in conjunction with the prior art, the phase shift optical mask was developed to improve the resolution of the photolithography technique. The phase shift optical mask includes a first region for transmitting the exposure light as it is and a second region for inverting the phase of the exposure light, and the second region is formed adjacent to, or in the vicinity of and surrounding (i.e., bordering) the first region. The widths of the first and second regions are determined by the wavelength of the exposure light and the NA of the exposure lens, and these first and second regions effectively utilize the phenomenon of light interference.

Figures 7A, 7B, 7C, 7D:
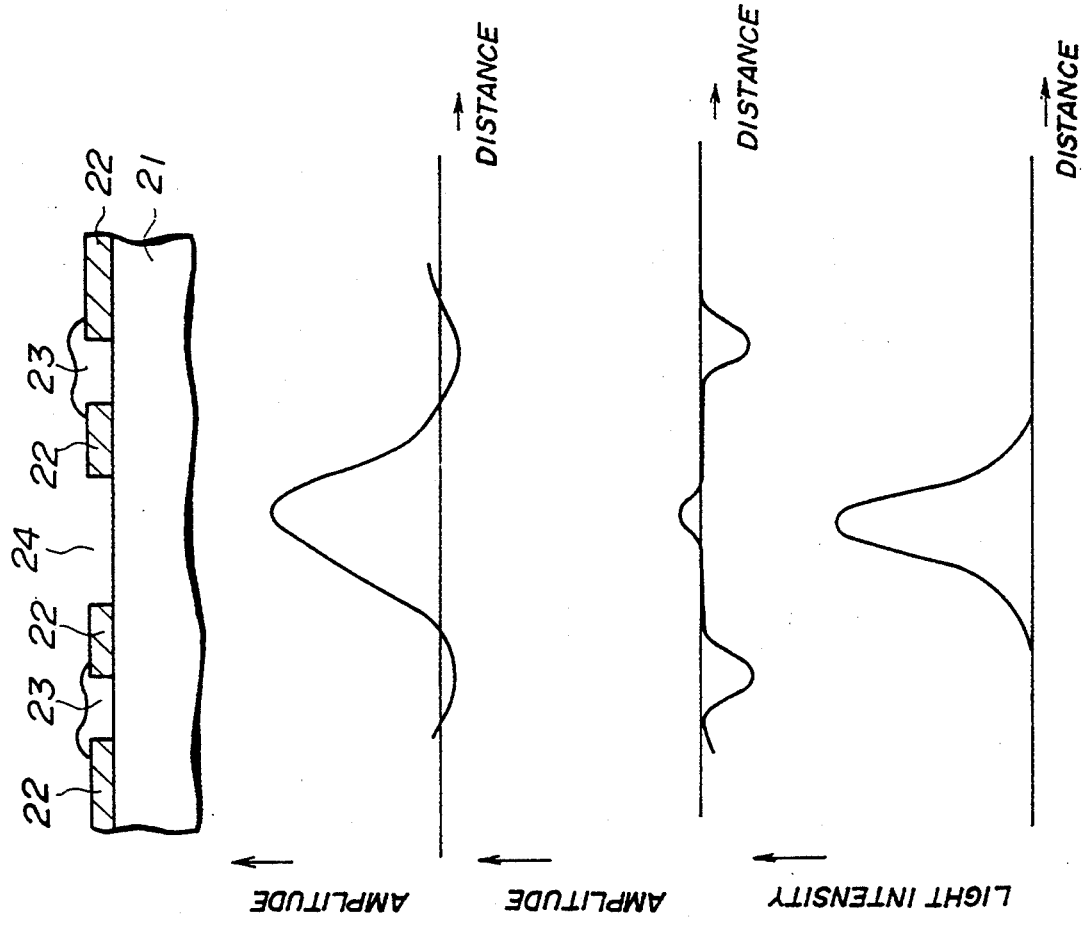
FIG. 7A is a cross sectional view for explaining a first conventional phase shift optical mask.
FIG. 7B shows amplitude and a phase characteristic of light transmitted through a light transmitting region of the phase shift optical mask shown in FIG. 7A.
FIG. 7C shows amplitude and phase characteristics of light transmitted through a phase shift region of the phase shift optical mask shown in FIG. 7A.
FIG. 7D shows light intensity of transmitted light in correspondence with FIG. 7A.

FIG. 7A shows a first conventional phase shift optical mask including a glass substrate 21, a Cr light blocking layer 22 and a SiO$_2$ phase shift layer 23. The amplitude of the exposure light which is transmitted through a light transmitting region 24 of this phase shift optical mask is shown in FIG. 7B, while the amplitude of the exposure light which is transmitted through the SiO$_2$ phase shift layer 23 is shown in FIG. 7C. In FIGS. 7B and 8C, a positive direction indicates a positive phase and a negative direction indicates an inverted phase. Hence, the light intensity of the exposure light transmitted through the phase shift optical mask, that is, the light intensity of the synthesized light made up of the exposure light transmitted through the light transmitting region 24 and the exposure light transmitted through the SiO$_2$ phase shift layer 23, becomes as shown in FIG. 7D. Therefore, it is possible to draw or expose an extremely thin line using this phase shift optical mask.

FIG. 8A shows a second conventional phase shift optical mask including a glass substrate 21, a Cr light blocking layer 25 and a SiO$_2$ phase shift layer 26. The amplitude of the exposure light which is transmitted through a light transmitting region 27 of this phase shift optical mask is shown in FIG. 8B, while the amplitude of the exposure light which is transmitted through the SiO$_2$ phase shift layer 26 is shown in FIG. 8C. In FIGS. 8B and 8C, a positive direction indicates a positive phase and a negative direction indicates an inverted phase. Hence, the light intensity of the exposure light transmitted through the phase shift optical mask, that is, the light intensity of the synthesized light made up of the exposure light transmitted through the light transmitting region 27 and of the exposure light transmitted through the SiO$_2$ phase shift layer 26, becomes as shown in FIG. 8D. Therefore, it is possible to draw or expose an extremely thin line using this phase shift optical mask.

Next, a description will be given of an operating principle of a second embodiment of the optical mask according to the present invention, in which the concepts of the first and second conventional phase shift optical masks shown in FIGS. 7A and 8A are combined so as to enable the drawing, or exposure, of an even thinner line.

Figure 9:
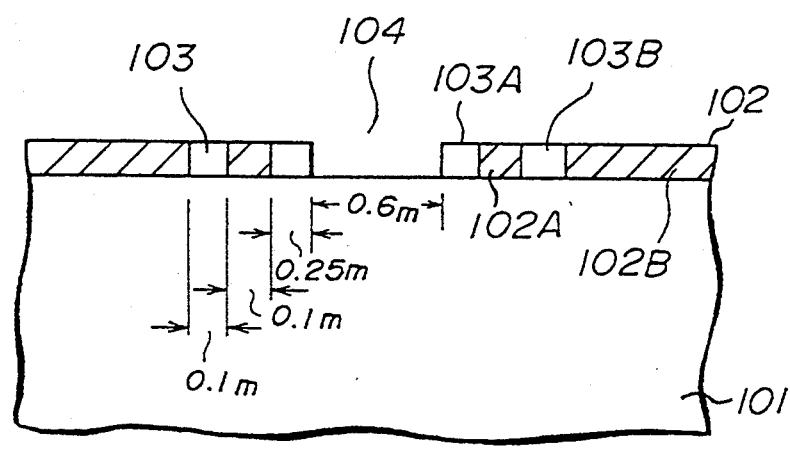
FIG. 9 is a cross sectional view for explaining an operating principle of a second embodiment of the optical mask according to the present invention.

Ideally, a phase shift optical mask which combines the concepts of the first and second conventional phase shift optical masks shown in FIGS. 7A and 8A has a structure as shown in FIG. 9. The phase shift optical mask shown in FIG. 9 includes a glass substrate 101, a Cr light blocking layer 102 which includes first and second light blocking regions 102A and 102B, a SiO$_2$ phase shift layer 103 which includes first and second phase shift regions 103A and 103B, and a light transmitting region 104.

But when the wavelength of the exposure light is 436 nm, the NA of the exposure lens is 0.45 and a line width of 0.4 μm is to be realized, for example, the width of the light transmitting region 104 must be set to m×0.6 μm, the width of the first phase shift region 103A must be set to m×0.25 μm, the width of the first light blocking region 102A must be set to m×0.1 μm, and the width of the second phase shift region 103B must be set to m×0.1 μm, where m denotes the reducing projection magnification which is normally 5 or less.

However, according to the existing techniques, it is extremely difficult to accurately align the first and second light blocking regions 102A and 102B and the first and second phase shift regions 103A and 103B which have the extremely small widths described above. Therefore, it is extremely difficult, if not impossible, to produce the phase shift optical mask shown in FIG. 9.

Figure 10:
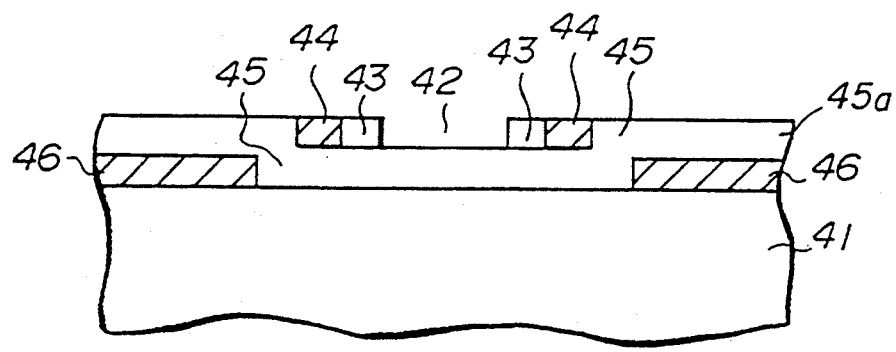
FIG. 10 is a cross sectional view showing an essential part of the second embodiment of the optical mask according to the present invention.

FIG. 10 shows an essential part of the second embodiment of the optical mask according to the present invention. The optical mask shown in FIG. 10 includes a light transmitting substrate 41, a light transmitting region 42, a first phase shift layer 43, a first light blocking layer 44, a second phase shift layer 45, and a second light blocking layer 46. For example, the light transmitting substrate 41 is made of quartz glass, the first and second phase shift layers 43 and 45 are made of SiO$_2$, and the first and second light blocking layers 44 and 46 are made of Cr.

The first phase shift layer 43 is provided at the outer sides (i.e., the edges) of the light transmitting region 42 and thus defining same. The first light blocking layer 44 is provided at the outer edges of the first phase shift layer 43 and thus defining same. The second phase shift layer 45 is provided at the outer sides (i.e., edges) of the first light blocking layer 44 and thus defining same. Furthermore, the second light blocking layer 46 is provided at the outer sides of the second phase shift layer 45 and thus defining same.

The light transmitting region 42 has a width on the order of $m(L+0.2 \lambda/NA)$, the first phase shift layer 43 has a width on the order of $(m\lambda/2 NA) [1.1-(NA/\lambda)(L+0.2 \lambda/NA)]$, and the first light blocking layer 44 has a width on the order of $0.1 m\lambda/NA$, where m denotes the reducing projection magnification, L denotes the width of the actual opening which is formed on the wafer, λ denotes the wavelength of the exposure light and NA denotes the numerical aperture of the exposure lens.

FIG. 11A shows the amplitude and phase characteristics of light transmitted through the light transmitting region 42, the first phase shift layer (region) 43 and the second phase shift layer (region) 45 of the optical mask shown in FIG. 10, and FIG. 11B shows the light intensity of the transmitted light in correspondence with FIG. 11A. In FIG. 11A, G denotes the amplitude of the light transmitted through the light transmitting region 42, H denotes the amplitude of the light transmitted through the first phase shift layer 43, and I denotes the amplitude of the light transmitted through the second phase shift layer 45. Hence, the intensity of the light transmitted through the optical mask shown in FIG. 10 as a whole is a synthesized light of G, H and I, as indicated by J in FIG. 11B. Hence, the effective exposure width can be set to 0.4 μm, for example, thereby enabling a considerable improvement of the resolution when compared to the conventional phase shift optical masks.

Of course, the light amplitudes and the light intensities of the light transmitted through the phase shift optical mask shown in FIG. 9 also become as shown in FIGS. 11A and 11B.

As will be described later in conjunction with FIG. 12C, it is also possible to provide a third phase shift layer 47 which covers the light transmitting region 42, the first phase shift layer 43, the first light blocking layer 44 and the second phase shift layer 45.

Figure 12A:
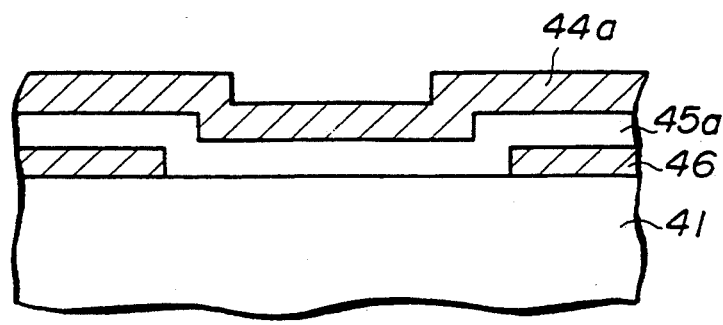
FIGS. 12A through 12C respectively are cross sectional views for explaining a second embodiment of the method of producing the optical mask according to the present invention.
Figure 12B:
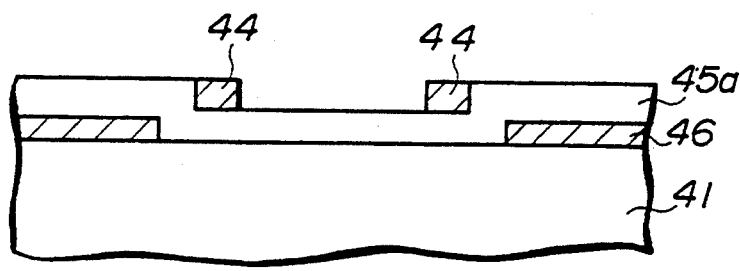

Next, a description will be given of a second embodiment of the method of producing the optical mask according to the present invention, by referring to FIGS. 12A through 12C. In this embodiment of the method, the second embodiment of the optical mask shown in FIG. 10 is produced. In FIGS. 12A through 12C, those parts which are the same as those corresponding parts in FIG. 10 are designated by the same reference numerals, and a description thereof will be omitted.

First, as shown in FIG. 12A, a Cr layer 46 is formed on the quartz glass substrate 41 to a thickness of 4700 Å which corresponds to $\lambda/(2n-2)$, where $\lambda$ denotes the wavelength of the exposure light and n denotes the refractive index of $SiO_2$ which is used as the phase shift material of this optical mask. An opening having a width of 7.5 $\mu$m is formed in the Cr layer 46 using a photolithography technique. Then, a $SiO_2$ layer 45a is formed to a thickness of 5000 521. This $SiO_2$ layer 45a covers the Cr layer 46 and the surface of the quartz glass substrate 42 which is exposed within the opening. Thereafter, a Cr layer 44a is formed on the $SiO_2$ layer 45a to a thickness of 5000 Å. As a result, each of the width of the side wall formed by the stepped part of the Cr layer 44a and the width of the side wall formed by the stepped part of the $SiO_2$ layer 45a is 0.5 $\mu$m.

Next, a reactive etching process step using a gas mixture of carbon tetrafluoride ($CF_4$) and oxygen ($O_2$) as the reactive gas is carried out to etch back the Cr layer 44a so as to leave a portion of the first light blocking layer 44 on the side wall of the stepped part of the $SiO_2$ layer 45a as shown in FIG. 12B.

Figure 12C:
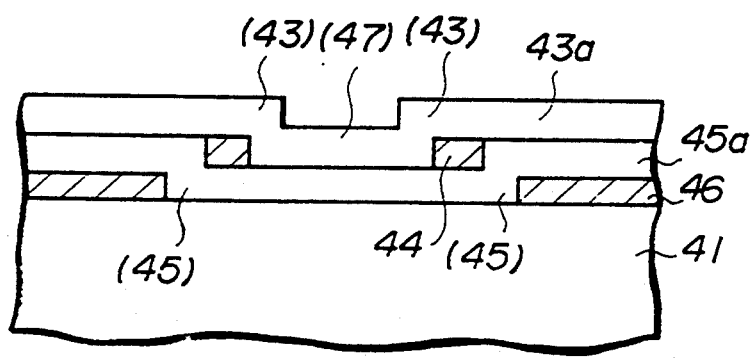

A $SiO_2$ layer 43a is thereafter formed on the surface of the structure shown in FIG. 12B to a thickness of 1 $\mu$m, as shown in FIG. 12C. The width of the side wall formed by the stepped part of this $SiO_2$ layer 43a is 1 $\mu$m.

Then, when the $SiO_2$ layer 43a is etched back by a reactive etching process step using $CF_4$ as the reactive gas, the first phase shift layer 43 is left on the side wall at the stepped part of the first light blocking layer 44 as shown in FIG. 10. The etching of layer 43a is stopped at the common level of the blocking layer 44 and thus the part of the $SiO_2$ layer 45a which remains on the opposite side wall part of the first light blocking layer 44 and extends to a portion respectively aligned with the stepped part of the Cr layer (second light blocking layer) 46 forms the second phase shift layer 45. In FIG. 10, an opening is formed in the $SiO_2$ layer 43a, which defines the phase shift layer (43) on the inner edge of the light blocking layer 44 and which opening furthermore defines the light transmitting region 42.

As a modification of the second embodiment of the method, it is possible to omit the process of etching back the $SiO_2$ layer 43a and stop at the stage shown in FIG. 12C. In this case, corresponding portions of the $SiO_2$ layers 43a and 45a become the light transmitting region 47 as indicated in brackets in FIG. 12C. Furthermore, as indicated in brackets (i.e., parentheses) in FIG. 12C, the first phase shift layer (43) in this case has a triple-layer structure made up of the original first phase shift layer 43 and the underlying portions of the $SiO_2$ layers 43a and 45a, and the second phase shift layer 45 has a triple-layer structure made up of the original second phase shift layer 45 and the corresponding, overlying portions of the $SiO_2$ layer 45a and the $SiO_2$ layer 43a.

Since the second embodiment of the method carries out an etch back process after forming a phase shift layer and a light blocking layer on a stepped surface, it is possible to form a phase shift layer and a light blocking layer having an extremely narrow width with a high accuracy. Therefore, it is possible to expose line patterns having a width of 0.4 $\mu$m or even less.

As may be seen by comparing FIGS. 12C and 4, the second embodiment of the optical mask shown in FIG. 12C may be regarded as the first embodiment of the optical mask shown in FIG. 4 added with the phase shift layer 43 and the light blocking layer 44.

Further, the present invention is not limited to these embodiments, but various variations and modifications may be made without departing from the scope of the present invention.

What is claimed is:

1. A phase shift optical mask for exposing a pattern using an exposure light, said phase shift optical mask comprising:

a substrate which is transparent with respect to the exposure light and which has a main surface;

a light blocking layer which is non-transparent with respect to the exposure light and is formed on the main surface of the said substrate, the light blocking layer having an opening therethrough of a desired size and shape defined by a corresponding, inner side wall of the light blocking layer, the opening exposing therethrough a corresponding portion of the substrate main surface, the corresponding main surface portion having defined centrally therein a main light transmitting region having an outer edge spaced from the inner sidewall of the light blocking layer and defining a phase shifting region therebetween;

a phase shift layer which is of uniform thickness and is transparent with respect to the exposure light, the phase shift layer including a first portion formed on the main light transmitting region, a second, stepped portion formed on the phase shifting region and on, and extending along, the inner sidewall of the light blocking layer, and a third portion formed on the light blocking layer, the second portion, further, extending from the substrate main surface to a common level with the surface of the third portion and having a thickness, between the common level and the main surface of the substrate, which is the sum of the thickness of the first phase shift layer portion and of the thickness of the light blocking layer; and the light blocking layer having a thickness selected such that the phase of the exposure light transmitted through the second, stepped portion of the phase shift layer, which is formed on the phase shifting region of the main surface portion of the substrate and extends along the inner sidewall of the light blocking layer, is shifted by approximately 180° relatively to the phase of the exposure light transmitted through the first portion of the phase shift layer, which is formed on the main light transmission region of the main surface portion of the substrate.

2. The phase shift optical mask as recited in claim 1, wherein the material of the substrate is quartz glass and the material of the phase shift layer is an inorganic material.

3. The phase shift optical mask as recited in claim 1, wherein the light blocking layer comprises a first layer which is non-transparent with respect to the exposure light and is formed on the substrate and a second layer which is formed on the first layer, the selected thickness of the light blocking layer being the sum of the respective thicknesses of the first and second layers.

4. The phase shift optical mask as recited in claim 1, wherein the material of the first layer is a metal and the material of the second layer is an inorganic material.

5. The phase shift optical mask as recited in claim 1, wherein the respective thicknesses of the first phase shift layer portion, relatively to the main surface portion of the substrate, of the second phase shift layer portion relatively to the inner sidewall of the light blocking layer, and of the third phase shift layer portion relatively to the surface of the light blocking layer, are identical.

6. A phase shift optical mask for exposing a pattern on a wafer through use of an exposure lens and an exposure light, the phase shift optical mask comprising:

a substrate which is transparent with respect to the exposure light and which has a main surface on which are defined a light transmitting region, first and second light blocking regions and first and second phase shift regions;

the second light blocking region having spaced side edges separated by a width L and defining therebetween a corresponding, first main surface portion of the substrate;

the light transmitting region being disposed centrally within the exposed first main surface portion of width L and defined by spaced side edges disposed adjacent to and inwardly of the respective, spaced side edges of the second light blocking region, the respective spaced side edges of the light transmitting region and of the first main surface portion defining respective border regions therebetween;

the light transmitting region having a width, between the spaced side edges thereof, of $m(L+0.2\ \lambda/NA)$, wherein m denotes a reducing projection magnification factor, $\lambda$ denotes the wave length of the exposure light and NA denotes the numerical value of the exposure lens;

each border region, extending between the respective, spaced and adjacent side edges of the light transmitting region and the second light blocking region, comprising the first and second phase shift regions and the first light blocking region, the first phase shift region having an inner edge in correspondence with the respective side edge of the light transmitting region and an outer edge, the first light blocking region having an inner edge in correspondence with the outer edge of the first phase shift region and an outer edge, and the second phase shift region having an inner edge in correspondence with the outer edge of the first light blocking region and an outer edge in correspondence with the inner edge of the second light blocking region;

the first phase shift region being transparent with respect to the exposure light and having a width in the order of $(m\lambda/2\ NA)$ between the inner and outer edges thereof;

the first light blocking region being non-transparent with respect to the exposure light and having a width in the order of $0.1\ m\lambda/NA$ between the inner and outer edges thereof;

the second phase shift region being transparent with respect to the exposure light and having a width in the order of $0.1\ m\lambda/NA$ between the inner and outer edges thereof; and the second light blocking region being non-transparent with respect to the exposure light.

7. The phase shift optical mask recited in claim 6, wherein the material of the substrate is quartz glass and the material of each of the first and second phase shift regions is a corresponding, inorganic material.

8. The phase shift optical mask recited in claim 6, wherein the material of each of the first and second light blocking regions is a corresponding metal.

9. The phase shift optical mask recited in claim 6, wherein:

in each border region, the first phase shift region comprises a first phase shift layer and a corresponding, first portion of a second phase shift layer, the first light blocking region comprises a first light blocking layer and a corresponding, second portion of the second phase shift layer, the second phase shift region comprises a stepped portion of the second phase shift layer, and the adjacent second light blocking region comprises a second light blocking layer and a corresponding, third portion of the second phase shift layer formed on the second light blocking layer;

the second light blocking layer is formed on the main surface of the substrate in the second light blocking region and has an opening therein corresponding to the first main surface portion of the substrate;

the second phase shift layer further comprises a fourth portion formed on the first main surface portion in the light transmitting region, in each border region the first portion thereof is formed on the main surface portion in the corresponding second phase shift regions of the respective border regions and including the respective, stepped portions being formed on the exposed main surface portion in the second phase shift region and having an outer sidewall formed on the inner sidewall of the second light blocking layer and an inner sidewall in correspondence with the inner edge of the second phase shift region, and a third portion formed on the second light blocking layer, the stepped portion integrally interconnecting the second and third portions thereof;

the first light blocking layer is formed on the second phase shift layer and has an outer sidewall in correspondence with and formed on the inner sidewall of the stepped portion of the second phase shift layer and an inner sidewall in correspondence with the inner edge of the first light blocking region; and the first phase shift layer is formed on the corresponding part of the second portion of the second phase shift layer and has an outer sidewall in correspondence with and formed on the inner sidewall of the first light blocking layer and an inner sidewall in correspondence with the respective side edge of the light transmitting region.

10. The phase shift optical mask recited in claim 6, wherein:

the light transmitting region comprises corresponding first portions of first and second phase shift layers and, in each border region, the first phase shift region comprises a stepped portion of the first phase shift layer and a corresponding, second portion of the second phase shift layer, the first light blocking region comprises a first light blocking layer a corresponding, second portion of the first phase shift layer and a corresponding, third portion of the second light blocking layer, the second phase shift region comprises a stepped portion of the second phase shift layer and a corresponding, third portion of the first phase shift layer, and the second light blocking region comprises a second light blocking layer and corresponding, fourth respective portions of the first and second phase shift layers;

the second light blocking layer is formed on the main surface of the substrate in the second light blocking region and has an opening therein, corresponding to the exposed main surface portion of the substrate, defined by an inner sidewall in correspondence with a respective side edge of the exposed main surface portion;

the first portion of the second phase shift layer is formed on the light transmitting region of the main surface portion of the substrate, the second, third and stepped portions thereof on the border region of the main surface portion of the substrate, and the fourth portion thereof on the adjacent, second light blocking layer, the stepped portion integrally interconnecting the third and fourth portions and extending from the main surface portion of the substrate to a common level with the surface of the fourth portion and having an outer sidewall formed on the inner sidewall of the second light blocking layer and an inner sidewall in correspondence with the inner edge of the second phase shift region;

the first light blocking layer is formed on the second phase shift layer and has an outer sidewall formed on the inner sidewall of the stepped portion of the second phase shift layer and an inner sidewall in correspondence with the inner edge of the second light blocking region;

the first portion of the first phase shift layer is formed on the first portion of the second phase shift layer in correspondence with the light transmitting region, and, in each border region, the stepped portion thereof is formed on the corresponding second portion of the second phase shift layer in correspondence with the first phase shift region and has an outer edge in correspondence with and formed on the inner sidewall of the first light blocking region, the third portion thereof is formed on the stepped portion of the second phase shift layer and the fourth portion thereof is formed on the.

11. A method of producing a phase shift optical mask, used for exposing a pattern using an exposure light, on the main surface of a substrate, comprising:

forming a light blocking layer on the main surface of the substrate and providing an opening in the light blocking layer defined by an inner sidewall of the light blocking layer for exposing a corresponding surface portion of the main surface of the substrate, the light blocking layer being non-transparent with respect to the exposure light and the substrate being transparent with respect to the exposure light and the opening having a shape and size defined by the inner sidewall of the light blocking layer; and forming a phase shift layer, of a material which is transparent with respect to the exposure light and of uniform thickness, including a first portion formed on the main surface portion of the substrate, a second, stepped portion formed on the exposed surface portion of the substrate and extending along and formed on the inner sidewall of the light blocking layer and a third portion formed on the light blocking layer, the second portion extending from the exposed surface portion of the substrate to a level common with the surface of the third portion; and the light blocking layer being formed in a thickness selected such that the phase of the exposure light which is transmitted through the second, stepped portion of the phase shift layer formed on the inner sidewall of the light blocking layer is shifted by approximately 180° relative to the phase of the exposure light which is transmitted through the first portion of the phase shift layer portion formed on the main surface portion of the substrate.

12. The method as recited in claim 11, wherein the material of the substrate is quartz glass and the material of the phase shift layer is an inorganic material.

13. The method as recited in claim 11, wherein the step of forming the light blocking layer further comprises:

forming a first layer which is non-transparent with respect to the exposure light, on the main surface of the substrate; and forming a second layer on the first layer thereby to form a composite light blocking layer of the first and second layers, the selected thickness being the sum of the respective thicknesses of the first and second layers.

14. The nethod as recited in claim 13, wherein the material of the first layer is a metal and the material of the second layer is an inorganic material.

15. The method as recited in claim 11, wherein the step of forming the phase shift layer further comprises:

forming the phase shift layer such that the respective thicknesses of the first portion relatively to the substrate main surface, of the second, stepped portion relatively to the inner sidewall of the light blocking layer and of the third portion relatively to the surface of the light blocking layer are identical.

16. A method of producing a phase shift optical mask on the main surface of a substrate, for exposing a pattern on a wafer via an exposure lens and employing an exposure light, comprising the steps of:

defining, on the main surface of the substrate, a first main surface portion bounded by spaced side edges separated by a width L, a light transmitting region disposed centrally within the main surface portion and bounded by spaced side edges which respectively are adjacent to and spaced inwardly of the spaced side edges of the first main surface portion and define corresponding border regions between the spaced and adjacent, respective side edges of the light transmitting region and the corresponding spaced side walls of the first main surface portion, the light transmitting region having a width, between the spaced side edges thereof, of $m(L+0.2 \lambda/NA)$ wherein m denotes a reducing projection magnification factor, $\lambda$ denotes the wavelength of the exposure light and NA denotes the numerical value of the exposure lens;

defining, within each border region:

a first phase shift region having an inner edge in correspondence with a respective side edge of the light transmitting region, an outer edge and a width $(m\lambda/2\ NA)$ between the inner and outer edges thereof, and which is transparent with respect to the exposure light, a first light blocking region having an inner edge in correspondence with the outer edge of the first phase shift region, an outer edge and a width 0.1 m$\lambda$/NA between the inner and outer edges thereof, and a second phase shift region having a width 0.1 m$\lambda$/NA between the inner and outer edges thereof and with the inner edge thereof in correspondence with the outer edge of the first light blocking region and the outer edge thereof in correspondence with a respective side edge of the first main surface portion;

defining a second light blocking region having inner edges spaced apart by and defining the first main surface portion and respectively in correspondence with the outer edge of the second phase shift region and correspondingly with a respective edge of the spaced side edges thereof;

forming a second phase shift layer of a material transparent to the exposure light, comprising a first portion formed on the main surface portion of the substrate in the light transmitting region, a second portion, a third portion and a stepped portion respectively formed on the main surface portion in the first phase shift region, the first light blocking region and the second phase shift region, respectively, of the boundary region, and a fourth portion formed on the surface of the second light blocking layer, the stepped portion integrally interconnecting the third and fourth portions and extending from the main surface of the substrate to a common level with the surface of the fourth portion thereof, the stepped portion having inner and outer sidewalls in correspondence with the inner and outer edges of the second phase shift region;

forming a first light blocking layer, of a material non-transparent to the exposure light, on the third portion of the second phase shift layer and on, and extending along, the inner sidewall of the stepped portion of the second phase shift layer and so as to have a surface at the common level and to have inner and outer sidewalls in correspondence with the inner and outer edges of the first light blocking region; and forming a first phase shift layer, of a material transparent to the exposure light, including a first portion formed on the first portion of the second phase shift layer and corresponding to the light transmitting region, a second, stepped portion corresponding to the first phase shift region and formed on a corresponding, second portion of the second phase shift layer and on and extending along the inner sidewall of the first light blocking layer and second, third and fourth portions on the common level surfaces of the first light blocking layer, the stepped portion and the fourth portion of the second phase shift layer.

17. The method as recited in claim 16, wherein the substrate is made of quartz glass and each of the first and second phase shift layers is made of inorganic material.

18. The method as recited in claim 17, wherein each of the first and second light blocking layers is made of a metal.

19. The method as recited in claim 16, further including:

etching back and thereby removing the first, second, third and fourth portions of the first phase shift layer and the part of the stepped portion of the first phase shift layer, above the common level while retaining the entirety of the second phase shift layer and the portion of the stepped portion of the first phase shift layer within the first phase shift region and extending from the second phase shift layer to the common level; and simultaneously etching back and removing the third portion of the first phase shift layer and the part of the second, stepped portion thereof which, as originally formed, extends above the common level.

20. A method of producing a phase shift optical mask on the main surface of a substrate, for exposing a pattern on a wafer via an exposure lens and employing an exposure light, comprising the steps of:

defining, on the main surface of the substrate, a first main surface portion bounded by spaced side edges separated by a width L, a light transmitting region disposed centrally within the main surface portion and bounded by spaced side edges which respectively are adjacent to and spaced inwardly of the spaced side edges of the first main surface portion and define corresponding border regions between the spaced and adjacent, respective side edges of the light transmitting region and the corresponding spaced side walls of the first main surface portion, the light transmitting region having a width, between the spaced side edges thereof, of m(L+0.2 $\lambda$/NA) wherein m denotes a reducing projection magnification factor, $\lambda$ denotes the wavelength of the exposure light and NA denotes the numerical value of the exposure lens;

defining, within each border region:

a first phase shift region having an inner edge in correspondence with a respective side edge of the light transmitting region, an outer edge and a width (m$\lambda$/2 NA) between the inner and outer edges thereof, and which is transparent with respect to the exposure light, a first light blocking region having an inner edge in correspondence with the outer edge of the first phase shift region, an outer edge and a width 0.1 m$\lambda$/NA between the inner and outer edges thereof, and a second phase shift region having a width 0.1 m$\lambda$/NA between the inner and outer edges thereof and with the inner edge thereof in correspondence with the outer edge of the first light blocking region and the outer edge thereof in correspondence with a respective side edge of the first main surface portion;

defining a second light blocking region having inner edges spaced apart by and defining the first main surface portion and respectively in correspondence with the outer edge of the second phase shift region and correspondingly with a respective edge of the spaced side edges thereof;

forming a second phase shift layer of a material transparent to the exposure light, comprising a first portion formed on the main surface portion of the substrate in the light transmitting region, a second portion, a third portion and a stepped portion respectively formed on the main surface portion in the first phase shift region, the first light blocking region and the second phase shift region, respectively of the boundary region, and a fourth portion formed on the surface of the second light blocking layer, the stepped portion integrally interconnecting the third and fourth portions and extending from the main surface of the substrate to a common level with the surface of the fourth portion thereof, the stepped portion having inner and outer sidewalls in correspondence with the inner and outer edges of the second phase shift region;

forming a first light blocking layer, of a material non-transparent to the exposure light, on the third portion of the second phase shift layer and on, and extending along, the inner sidewall of the stepped portion of the second phase shift layer and so as to have a surface at the common level and to have inner and outer sidewalls in correspondence with the inner and outer edges of the first light blocking region; and forming a first phase shift layer, of a material transparent to the exposure light, on the corresponding second portion of the second phase shift layer and on, and extending along, the inner sidewall of the first light blocking layer to the common level of the first light blocking layer and the second phase shift layer, the first phase shift layer having inner and outer sidewalls corresponding to the inner and outer edges of the first phase shift region.

21. The method as recited in claim 20, wherein the substrate is made of quartz glass and each of the first and second phase shift layers is made of inorganic material.

22. The method as recited in claim 20, wherein each of the first and second light blocking layers is made of a metal.

23. A phase shift optical mask for exposing a pattern on a wafer through use of an exposure lens and an exposure light, the phase shift optical mask comprising:

a substrate which is transparent with respect to the exposure light and which has a main surface on which there are defined a light transmitting region having first and second, spaced and parallel edges extending in a first direction and, spaced in a second direction, transverse to the first direction and extending respectively from the first and second edges of the light transmission region, first and second border regions respectively comprising, in succession, first and second inner phase shift regions, first and second intermediate light blocking regions, first and second outer phase shift regions and first and second outer light blocking regions;

the first and second outer light blocking regions being spaced apart in the second direction by a width L, each of the first and second intermediate light blocking regions and each of the first and second outer phase shift regions having a width, in the second direction, of 0.1 m $\lambda$/NA and each of the first and second inner phase shift regions having a width of (m$\lambda$/2 NA);

an outer light blocking layer, of a material non-transparent to the exposure light and of a first thickness, covering the first and second outer light blocking regions;

an outer phase shift layer of a second thickness and comprising respective integral portions formed on and covering the light transmission region, the boundary regions, and the first and second outer light blocking regions, the outer phase shift layer including first and second stepped portions in the first and second outer phase shift regions, each having a combined thickness of the first and second thicknesses and having a common surface level with the surface of the portions of the outer phase shift layer formed on the first and second outer light blocking regions;

first and second intermediate light blocking layers, of a common material non-transparent to the exposure light, formed on the surface of the outer phase shift layer in the respective first and second intermediate light blocking regions and having a surface at the common surface level; and first and second inner phase shift layers formed on the surface of the outer phase shift layer in the respective first and second inner phase shift regions and having corresponding surfaces at the common surface level.

24. A phase shift optical mask for exposing a pattern on a wafer through use of an exposure lens and an exposure light, the phase shift optical mask comprising:

a substrate which is transparent with respect to the exposure light and which has a main surface on which there are defined a light transmitting region having first and second, spaced and parallel edges extending in a first direction and, spaced in a second direction, transverse to the first direction and extending respectively from the first and second edges of the light transmission region, first and second border regions respectively comprising, in succession, first and second inner phase shift regions, first and second intermediate light blocking regions, first and second outer phase shift regions and first and second outer light blocking regions;

the first and second outer light blocking regions being spaced apart in the second direction by a width L, each of the first and second intermediate light blocking regions and each of the first and second outer phase shift regions having a corresponding width, in the second direction, of 0.1 m $\lambda$/NA and each of the first and second inner phase shift regions having a width of (m$\lambda$/2 NA);

an outer light blocking layer, of a material non-transparent to the exposure light and of a first thickness, covering the first and second outer light blocking regions;

an outer phase shift layer of a second thickness and comprising respective, integral portions formed on and covering the light transmission region, the boundary regions, and the first and second outer light blocking regions, the outer phase shift layer including first and second stepped portions in the first and second outer phase shift regions, each having a combined thickness of the first and second thicknesses and having a common surface level with the surface of the portions of the outer phase shift layer formed on the first and second outer light blocking regions;

first and second intermediate light blocking layers, of a common material non-transparent to the exposure light, formed on the surface of the outer phase shift layer in the respective first and second intermediate light blocking regions and having corresponding surfaces at the common surface level; and an inner phase shift layer of a third thickness, formed on the outer phase shift layer in the portion thereof, extending between the first and second intermediate light blocking layers, on the intermediate light blocking layers and on the portions of the outer phase shift layer formed on the outer blocking layer and including first and second stepped portions respectively in the first and second inner phase shift regions, each having a surface at the common surface level of the inner phase shift layer portions formed respectively on the first and second intermediate light blocking layers.

26. A method of producing a phase shift optical mask for exposing a pattern on a wafer through use of an exposure lens and an exposure light, said method comprising the steps of:

providing a substrate which is transparent with respect to the exposure light and which has a main surface and defining thereon a light transmitting region having first and second, spaced and parallel edges extending in a first direction and, spaced in a second direction transverse to the first direction and extending, respectively, from the first and second edges of the light transmission region, first and second border regions respectively comprising, in succession, first and second inner phase shift regions, first and second intermediate light blocking regions, first and second outer phase shift regions and first and second outer light blocking regions;

spacing the first and second outer light blocking regions apart in the second direction by a width L, each of the first and second intermediate light blocking regions and each of the first and second outer phase shift regions having a width, in the second direction, of 0.1 m $\lambda$/NA and each of the first and second inner phase shift regions having a width of (m$\lambda$/2 NA);

forming an outer light blocking layer, of a material non-transparent to the exposure light and of a first thickness, covering the first and second outer light blocking regions;

forming an outer phase shift layer of a second thickness and comprising respective, integral portions formed on and covering the light transmission region, the boundary regions, and the first and second outer light blocking regions, the outer phase shift layer including first and second stepped portions in the first and second outer phase shift regions, each having a combined thickness of the first and second thicknesses and having a common surface level with the surface of the portions of the outer phase shift layer formed on the first and second outer light blocking regions;

forming first and second intermediate light blocking layers, of a common material non-transparent to the exposure light, formed on the surface of the outer phase shift layer in the respective first and second intermediate light blocking regions and having a surface at the common surface level; and forming first and second inner phase shift layers on the surface of the outer phase shift layer in the respective first and second inner phase shift regions and having corresponding surfaces at the common surface level.

26. A method as recited in claim 25, further comprising etching back and thereby removing the inner phase shift layer extending above the common surface level in the boundary region and etching back and removing the portion of the first phase shift layer formed on and covering the second phase shift layer in the light transmission region.

27. A method of producing a phase shift optical mask for exposing a pattern on a wafer through use of an exposure lens and an exposure light, the phase shift optical mask said method comprising the steps of:

providing a substrate which is transparent with respect to the exposure light and which has a main surface on which there are defined a light transmitting region having first and second, spaced and parallel edges extending in a first direction and, spaced in a second direction, transverse to the first direction and extending respectively from the first and second edges of the light transmission region, first and second border regions respectively comprising, in succession, first and second inner phase shift regions, first and second intermediate light blocking regions, first and second outer phase shift regions and first and second outer light blocking regions;

spacing the first and second outer light blocking regions apart in the second direction by a width L, each of the first and second intermediate light blocking regions and each of the first and second outer phase shift regions having a width, in the second direction, of 0.1 m $\lambda$/NA and each of the first and second inner phase shift regions having a width of (m$\lambda$/2 NA);

forming an outer light blocking layer, of a material non-transparent to the exposure light and of a first thickness, covering the first and second outer light blocking regions;

forming an outer phase shift layer of a second thickness and comprising respective integral portions formed on and covering the light transmission region, the boundary regions, and the first and second outer light blocking regions, the outer phase shift layer including first and second stepped portions in the first and second outer phase shift regions, each having a combined thickness of the first and second thicknesses and having a common surface level with the surface of the portions of the outer phase shift layer formed on the first and second outer light blocking regions;

forming first and second intermediate light blocking layers, of a common material non-transparent to the exposure light, formed on the surface of the outer phase shift layer in the respective first and second intermediate light blocking regions and having corresponding surfaces at the common surface level; and forming an inner phase shift layer of a third thickness, formed on the outer phase shift layer in the portion thereof, extending between the first and second intermediate light blocking layers, and on the intermediate light blocking layers and on the portions of the outer phase shift layer formed on the outer blocking layer and including first and second stepped portions respectively in the first and second inner phase shift regions, each having a surface at the common surface level of the inner phase shift layer portions formed respectively on the first and second intermediate light blocking layers.

* * * * *

UNITED STATES PATENT AND TRADEMARK OFFICE
CERTIFICATE OF CORRECTION

PATENT NO. : 5,424,153             Page 1 of 2
DATED      : June 13, 1995
INVENTOR(S): Satoru ASAI It is certified that error appears in the above-indentified patent and that said Letters Patent is hereby corrected as shown below:

Col. 1,   line 7, insert

--Cross Reference to Related Application

The subject application is related to USSN 07/516,347 filed April 27, 1990 and assigned to the common assignee herewith.--;

line 61, change "there a" to --there is a--;
line 62, change "13" to --13,--.

Col. 3,   line 7, change "a" to --the--.

Col. 11,  line 23, change "521" to --Å--.

Col. 15,  lines 39-50, delete in its entirety and substitute therefore the following:

--       the first portion of the first phase shift layer is formed on the first portion of the second phase shift layer in correspondence with the light transmitting region, and, in each border region, the stepped portion thereof is formed on the corresponding second portion of the second phase shift layer in correspondence with the first phase shift region and has an outer edge in correspondence with and formed on the inner sidewall of the first light blocking region, a second portion thereof is formed on the first light blocking layer, the third portion thereof is formed on the stepped portion of the second phase shift layer and the fourth portion thereof is formed on the fourth portion of the second phase shift layer.--

UNITED STATES PATENT AND TRADEMARK OFFICE
CERTIFICATE OF CORRECTION

PATENT NO. : 5,424,153
DATED : June 13, 1995
INVENTOR(S) : Satoru ASAI

It is certified that error appears in the above-indentified patent and that said Letters Patent is hereby corrected as shown below:

Col. 16, line 32, change "nethod" to --method--.

Signed and Sealed this

Third Day of December, 1996

Attest:

BRUCE LEHMAN

Attesting Officer    Commissioner of Patents and Trademarks